(12) United States Patent
Jou et al.

(10) Patent No.: US 8,803,286 B2
(45) Date of Patent: Aug. 12, 2014

(54) LOW COST METAL-INSULATOR-METAL CAPACITORS

(75) Inventors: Chewn-Pu Jou, Hsin-Chu (TW); Tse-Hua Lu, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 841 days.

(21) Appl. No.: 12/940,523

(22) Filed: Nov. 5, 2010

(65) Prior Publication Data

US 2012/0112314 A1    May 10, 2012

(51) Int. Cl.
*H01L 29/92* (2006.01)

(52) U.S. Cl.
USPC .................................. 257/532; 257/E29.342

(58) Field of Classification Search
USPC .......................................... 257/532, E29.342
See application file for complete search history.

(56) References Cited

U.S. PATENT DOCUMENTS

| | | |
|---|---|---|
| 2004/0027783 A1 | 2/2004 | Wang et al. |
| 2005/0006688 A1* | 1/2005 | Solo De Zaldivar .......... 257/306 |
| 2011/0115050 A1* | 5/2011 | Lin ................................ 257/532 |

FOREIGN PATENT DOCUMENTS

CN            1404127 A         3/2003

* cited by examiner

*Primary Examiner* — Marc Armand
(74) *Attorney, Agent, or Firm* — Slater and Matsil, L.L.P.

(57) ABSTRACT

A device includes a top metal layer over a substrate; a copper-containing metal feature in the top metal layer; a passivation layer over the top metal layer; and a capacitor. The capacitor includes a bottom electrode including at least a portion in the first passivation layer, wherein the bottom electrode includes aluminum; an insulator over the bottom electrode; and a top electrode over the insulator.

19 Claims, 13 Drawing Sheets

LOW COST METAL-INSULATOR-METAL CAPACITORS

BACKGROUND

Metal-insulator-metal (MIM) capacitors have been widely used in functional circuits such as mixed-signal circuits, analog circuits, radio frequency (RF) circuits, dynamic random access memories (DRAM), embedded DRAM, and logic operation circuits. Conventional MIM capacitors were formed in interconnect structures. Since the interconnect structures include copper lines and copper vias formed of damascene processes, the formation of conventional MIM capacitors were integrated with the damascene processes. For example, a bottom electrode of a MIM capacitor may be formed in one of metal layers in the interconnect structure, while the top electrode of the MIM capacitor may be formed between two metal layers.

The conventional MIM capacitor formation processes suffer from drawbacks. The commonly used capacitor-insulator materials such as silicon oxide and silicon nitride react with copper. Since the insulator layers of the MIM capacitors are thin, their thicknesses need to be accurately controlled. Accordingly, the reaction between copper and the insulators may significantly affect the thickness and the quality of the insulators, and in turn cause the degradation of the capacitance and the reliability of the MIM capacitors. Additional process steps and layers are thus needed to prevent such reaction. The manufacturing cost is thus increased. Further, the formation of MIM capacitors results in additional parasitic capacitance, particular for MIM capacitors formed in low-level metal layers, in which the densities of metal lines are high.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel metal-insulator-metal (MIM) capacitor and the method of forming the same are provided in accordance with an embodiment. The intermediate stages of manufacturing the MIM capacitor in accordance with an embodiment are illustrated. The variations of the embodiment are discussed. Throughout the various views and illustrative embodiments, like reference numbers are used to designate like elements.

Figure 1:
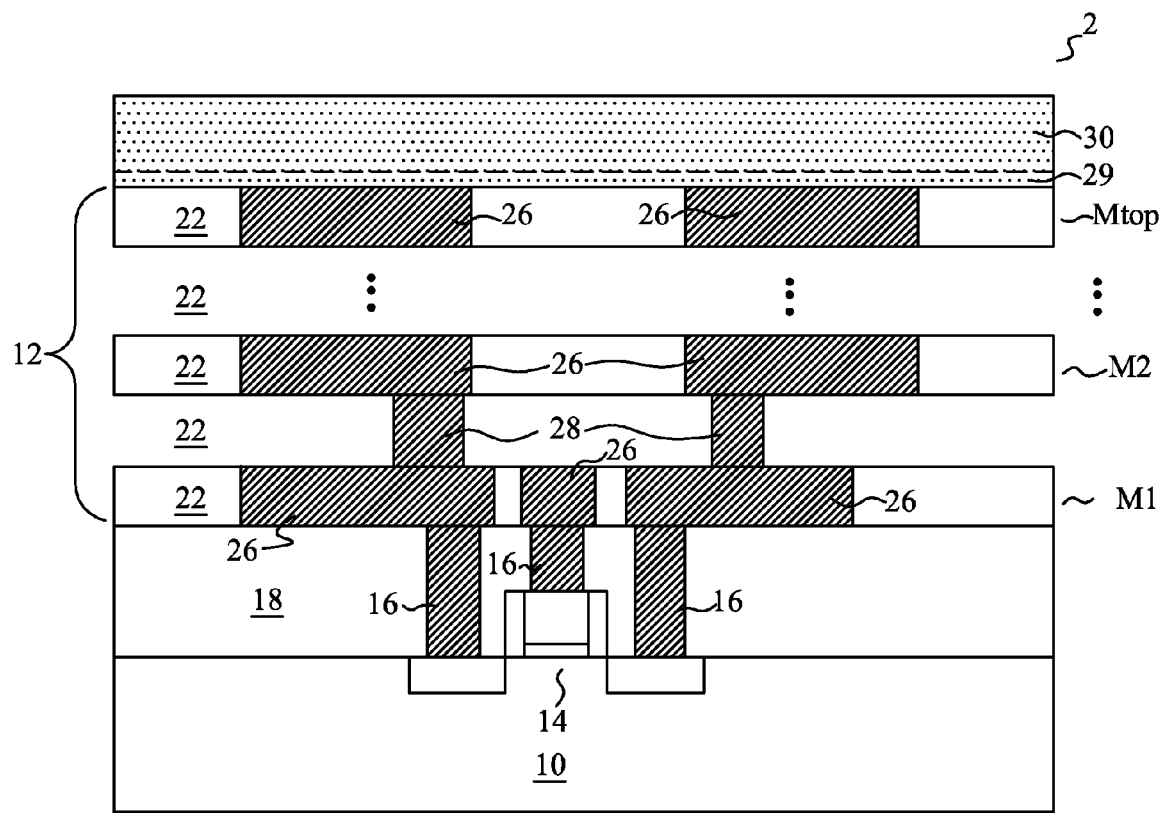
FIGS. 1 through 11 are cross-sectional views of intermediate stages in the manufacturing of a metal-insulator-metal (MIM) capacitor in accordance with various embodiments.

Referring to FIG. 1, wafer 2, which includes substrate 10, is provided. In an embodiment, substrate 10 is a semiconductor substrate, such as a silicon substrate, although it may include other semiconductor materials, such as silicon germanium, silicon carbide, gallium arsenide, or the like. Semiconductor devices 14 may be formed at a surface of substrate 10. A transistor is schematically illustrated to represent semiconductor devices 14. Contact plugs 16 are formed in inter-layer dielectric (ILD) 18, and are electrically coupled to the gate, the source, and the drain region of transistor 14. Interconnect structure 12, which includes metal lines 26 and vias 28 therein and electrically coupled to semiconductor devices 14, is formed over ILD 18. Metal lines 26 and vias 28 may be formed of substantially pure copper (for example, with a weight percentage of copper greater than about 90 percent, or greater than about 95 percent) or copper alloys, and may be formed using the well-known damascene processes. Metal lines 26 and vias 28 may be, or may not be, substantially free from aluminum. Interconnect structure 12 includes a plurality of metal layers, namely M1, M2 . . . Mtop, wherein metal layer M1 is the metal layer immediately above ILD 18, while metal layer Mtop is the top metal layer that is under passivation layer(s). Metal layers M1 through Mtop are formed in inter-metal dielectrics (IMDs) 22, which may be formed of low-k dielectric layers having k values lower than 3.8. In some embodiments, the k values of the low-k dielectric layers are lower than about 3.0, and may be lower than about 2.5.

Passivation layer 30 is formed over metal layer Mtop. Passivation layer 30 either contacts metal layer Mtop, or closely located above top metal layer Mtop with etch stop layer 29 therebetween. In an embodiment, passivation layer 30 is formed of dielectric materials that are denser, and having greater k values, than the dielectric materials of IMDs 22. For example, passivation layer 30 may comprise a non-low-k dielectric material such as silicon oxide, silicon nitride, and the like, which have k values greater than 3.9.

Figure 2:
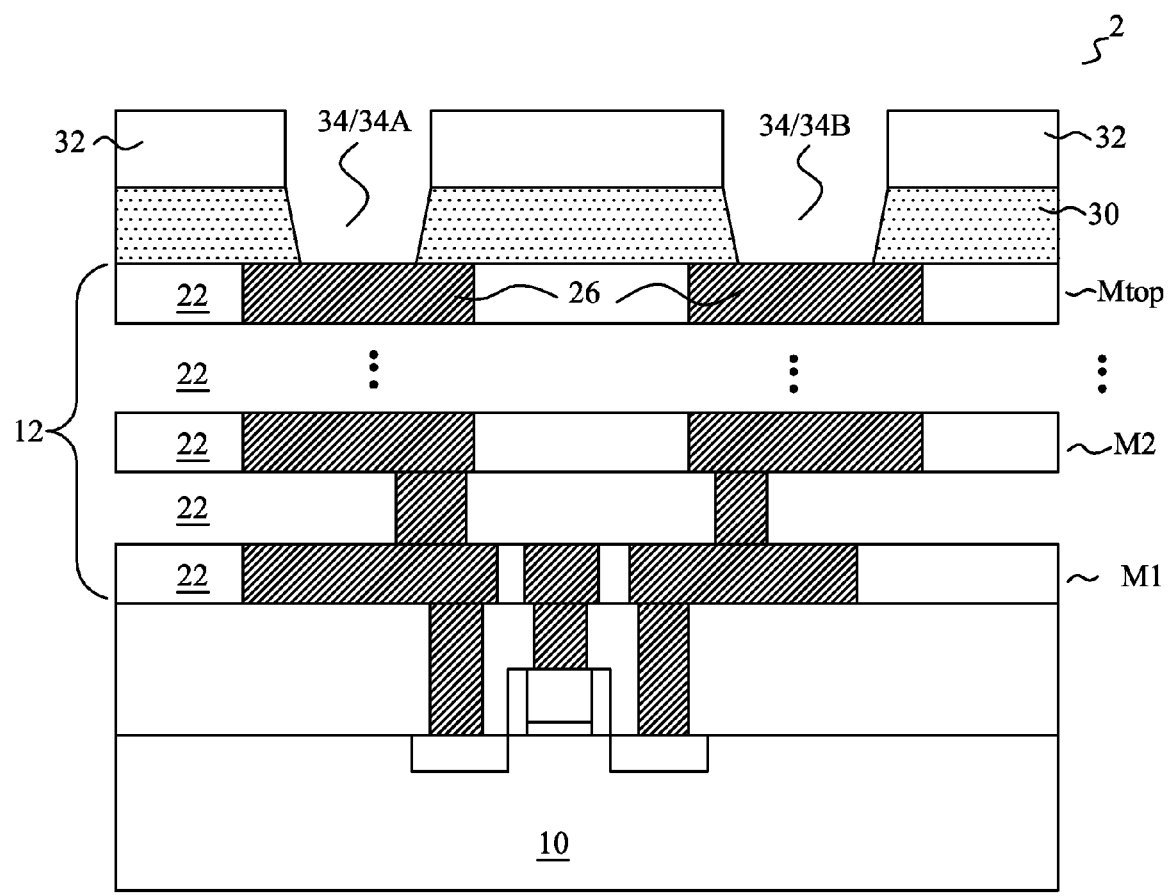

Next, referring to FIG. 2, photo resist 32 is formed over passivation layer 30, and is patterned. Passivation layer 30 is then patterned using photo resist 32 as a mask to form openings 34 (including openings 34A and 34B). Metal lines (or metal pads) 26 in top metal layer Mtop are exposed through openings 34. Photo resist 32 is then removed.

Figure 3:
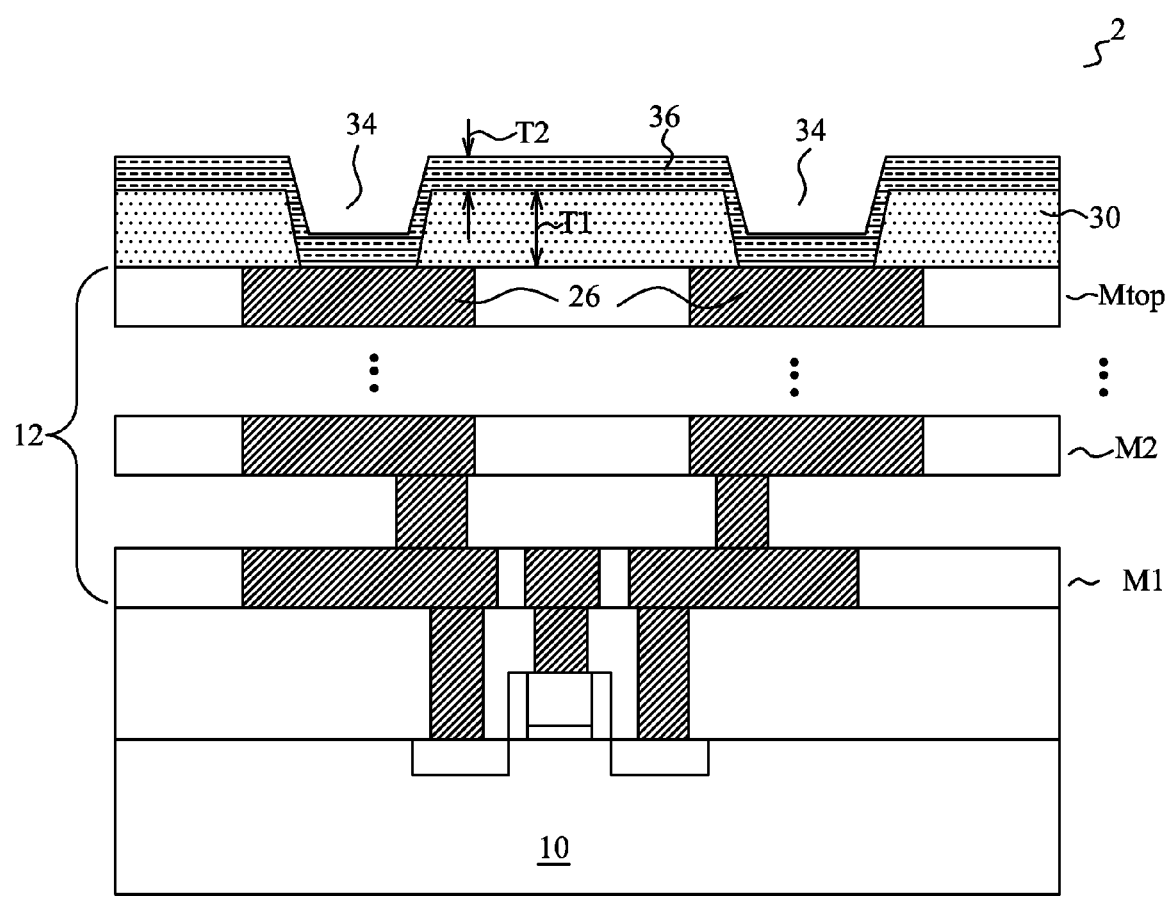

FIG. 3 illustrates the deposition of aluminum-containing layer 36. In an embodiment, aluminum-containing layer 36 is formed of substantially pure aluminum, for example, with the weight percentage of aluminum greater than about 95 percent. In alternative embodiments, aluminum-containing layer 36 comprises aluminum and copper, with copper having a weight percentage less than about 5 percent, for example. Thickness T2 of aluminum-containing layer 36 is smaller than thickness T1 of passivation layer 30, although thickness T2 may also be equal to or greater than thickness T1. The formation methods of aluminum-containing layer 36 include physical vapor deposition (PVD) or other suitable deposition methods. Aluminum-containing layer 36 extends into openings 34, and hence is in contact with, and is electrically coupled to, metal lines 26 in top metal layer Mtop.

Figure 4:
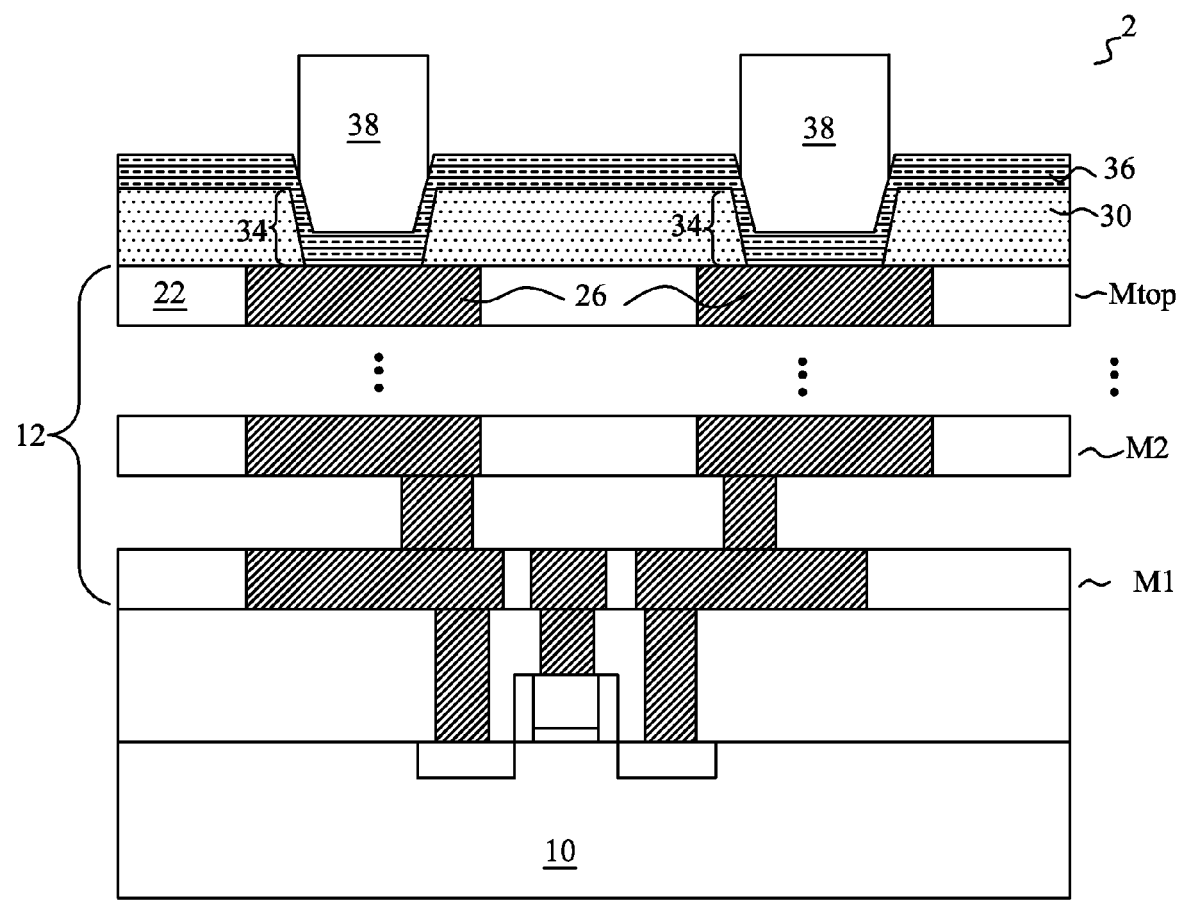
Figure 5A:
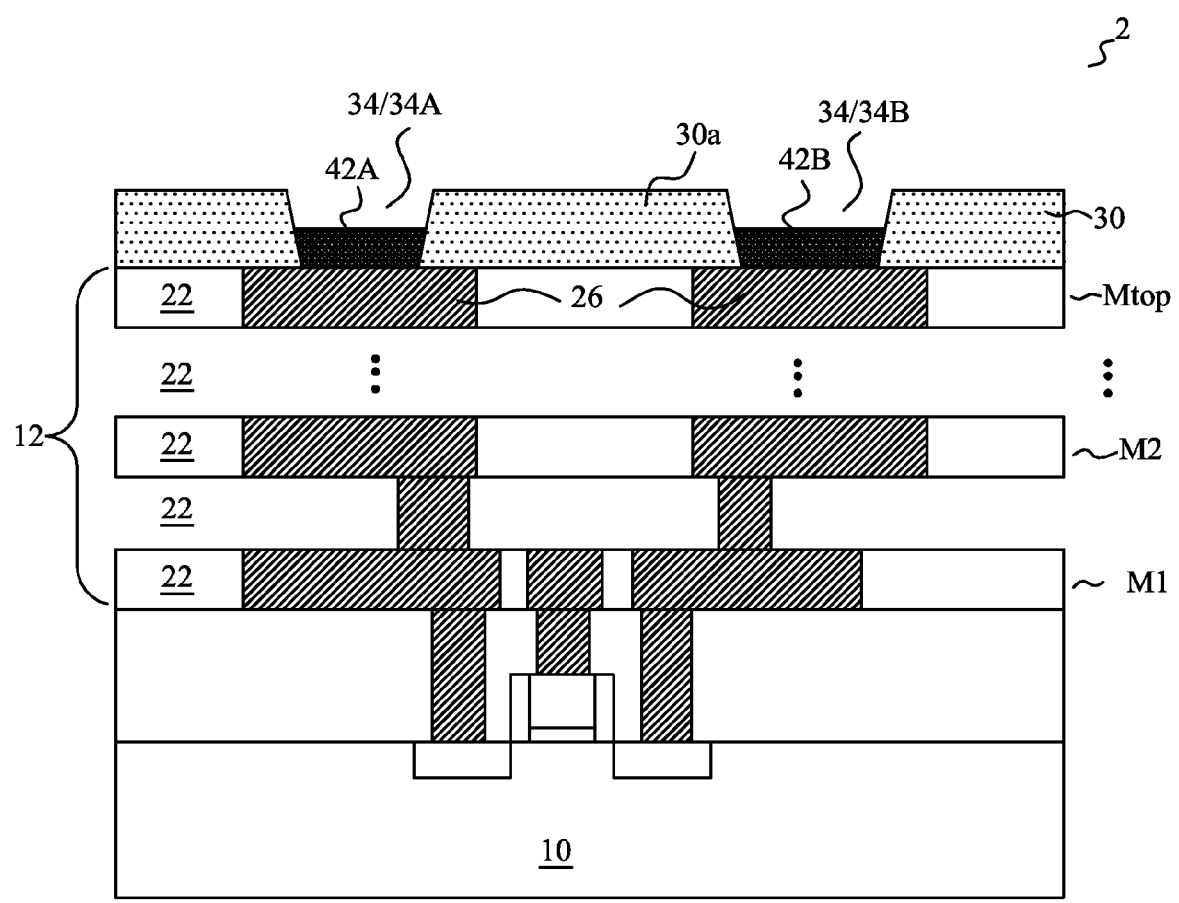

FIGS. 4 and 5A illustrate the patterning of aluminum-containing layer 36. In FIG. 4, photo resist 38 is formed and patterned, and is then used to pattern aluminum-containing layer 36, as shown in FIG. 5A. As a result, portions of aluminum-containing layer 36 outside openings 34 are removed, while the portions of aluminum-containing layer 36 in openings 34 remain. Photo resist 38 is removed after the patterning of aluminum-containing layer 36. Although FIG. 5A illustrates that the remaining portions of aluminum-containing layer 36 are limited in openings 34, they may also extend out of openings 34 and extend to directly over the top surface of passivation layer 30. The portions of aluminum-containing layer 36 in openings 34A and 34B are referred to as aluminum-containing pads 42A and 42B, respectively, hereinafter.

Figure 5B:
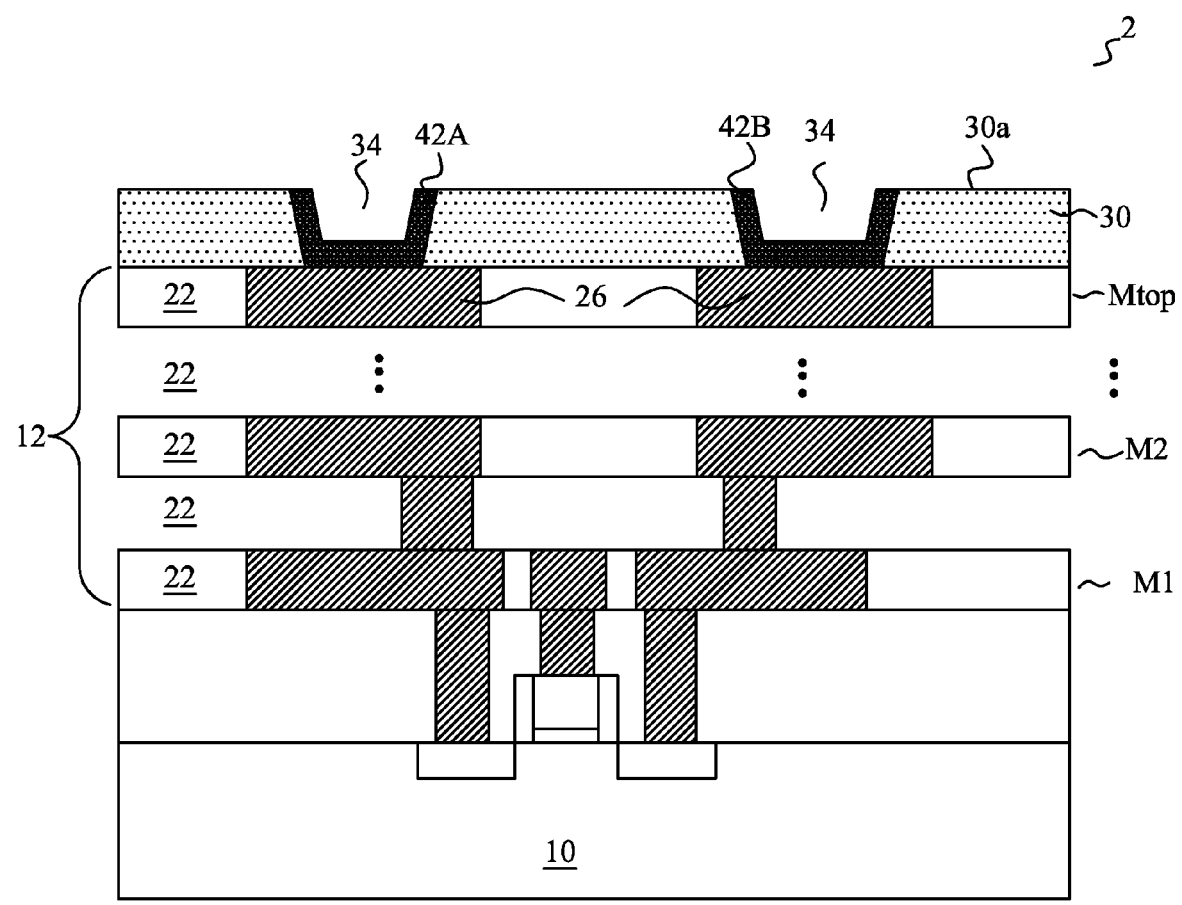

In alternative embodiments, instead of using photo resist 38 to pattern aluminum-containing layer 36, a chemical mechanical polish (CMP) may be performed on the aluminum-containing layer 36 as shown in FIG. 3. As a result, as shown in FIG. 5B, the portions of aluminum-containing layer 36 above passivation layer 30 are removed, while the portions of aluminum-containing layer 36 in openings 34 remain unremoved, and are referred to as aluminum-containing pads 42A and 42B, respectively. In the resulting structure, the top edges of aluminum-containing pads 42A and 42B are substantially level with top surface 30a of passivation layer 30. As a comparison, in the structure as shown in FIG. 5A, the top edges of aluminum-containing pads 42A and 42B may be lower than (or higher than) top surface 30a of passivation layer 30.

Figure 6:
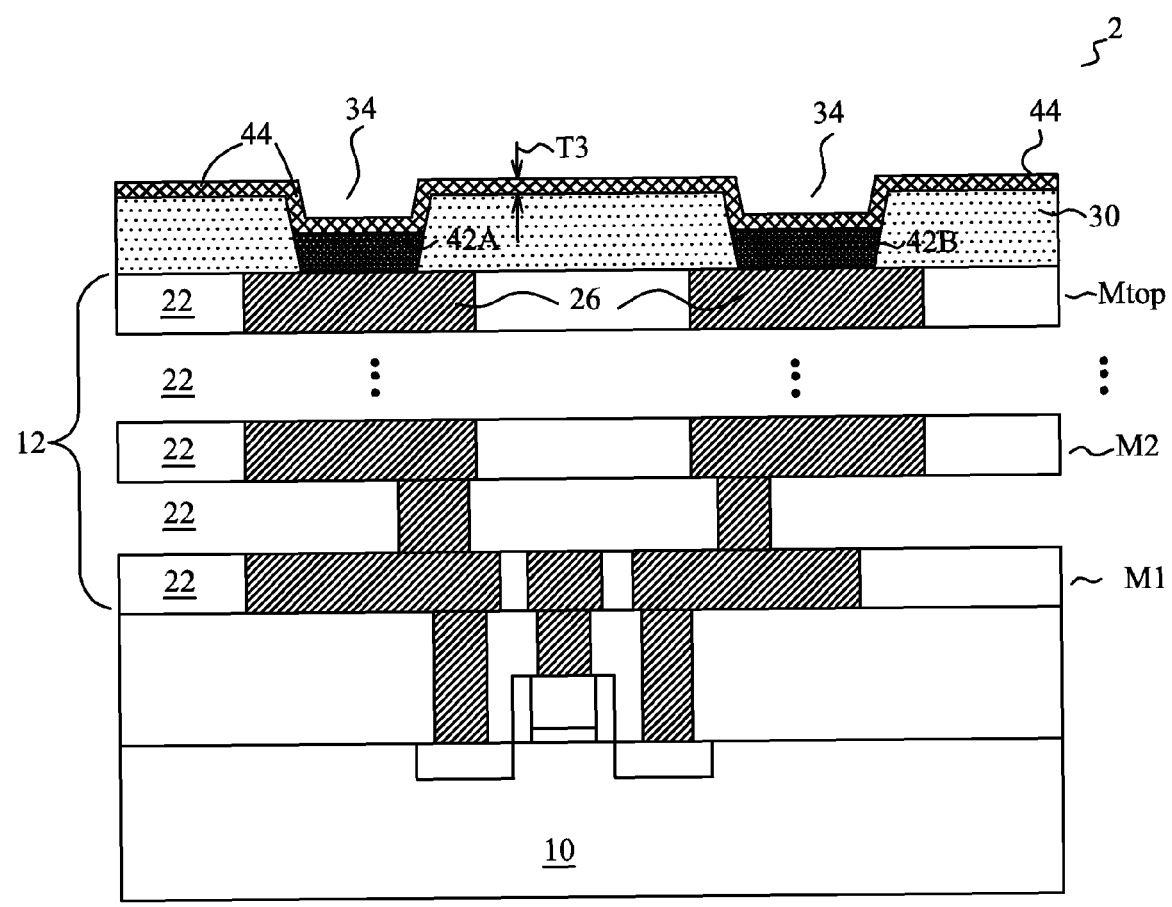

In FIG. 6, insulation layer 44 is formed, and may comprise silicon oxide, silicon nitride, or multi-layers thereof. Thickness T3 of insulation layer 44 is carefully controlled. In an exemplary embodiment, thickness T3 is between about 150 Å and about 300 Å. Furthermore, insulation layer 44 may be formed as a conformal layer with the thickness of the sidewall portions in openings 34 substantially equal to the thickness of horizontal portions.

Figure 7:
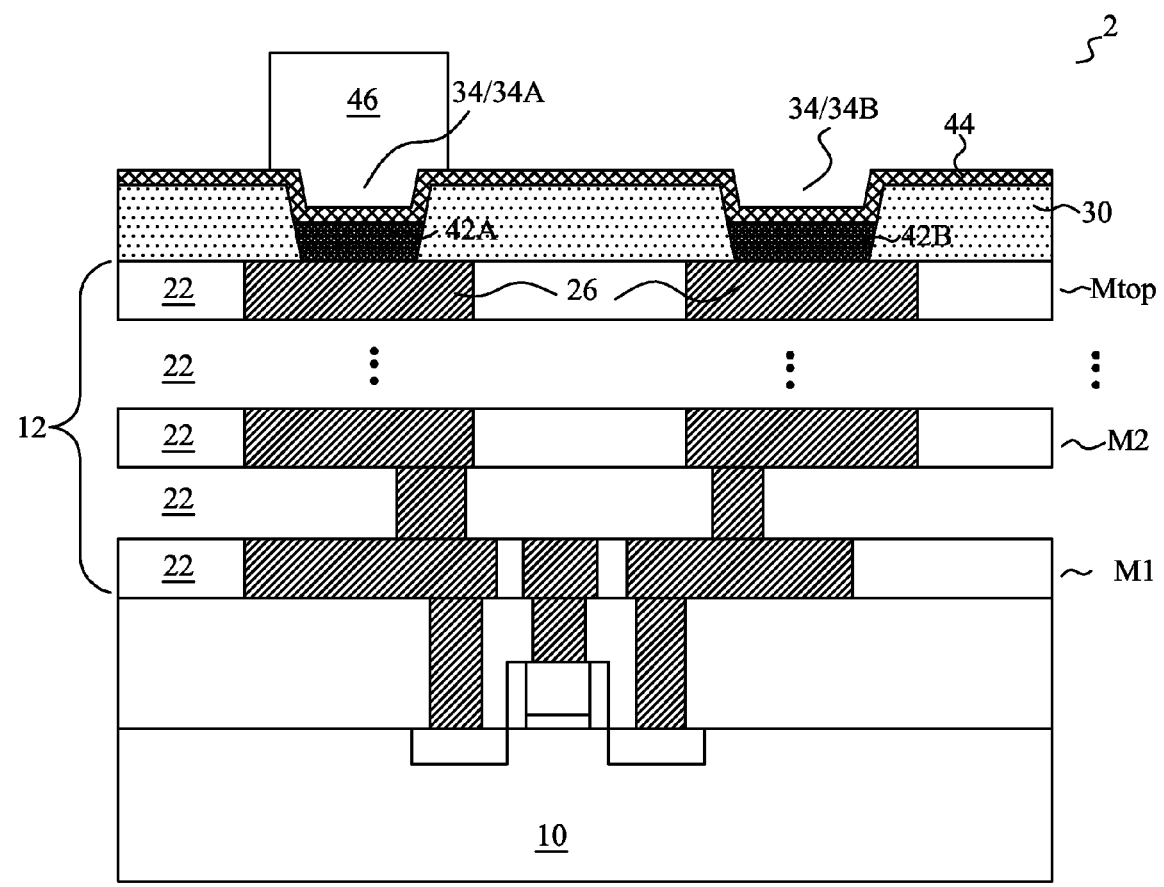
Figure 8:
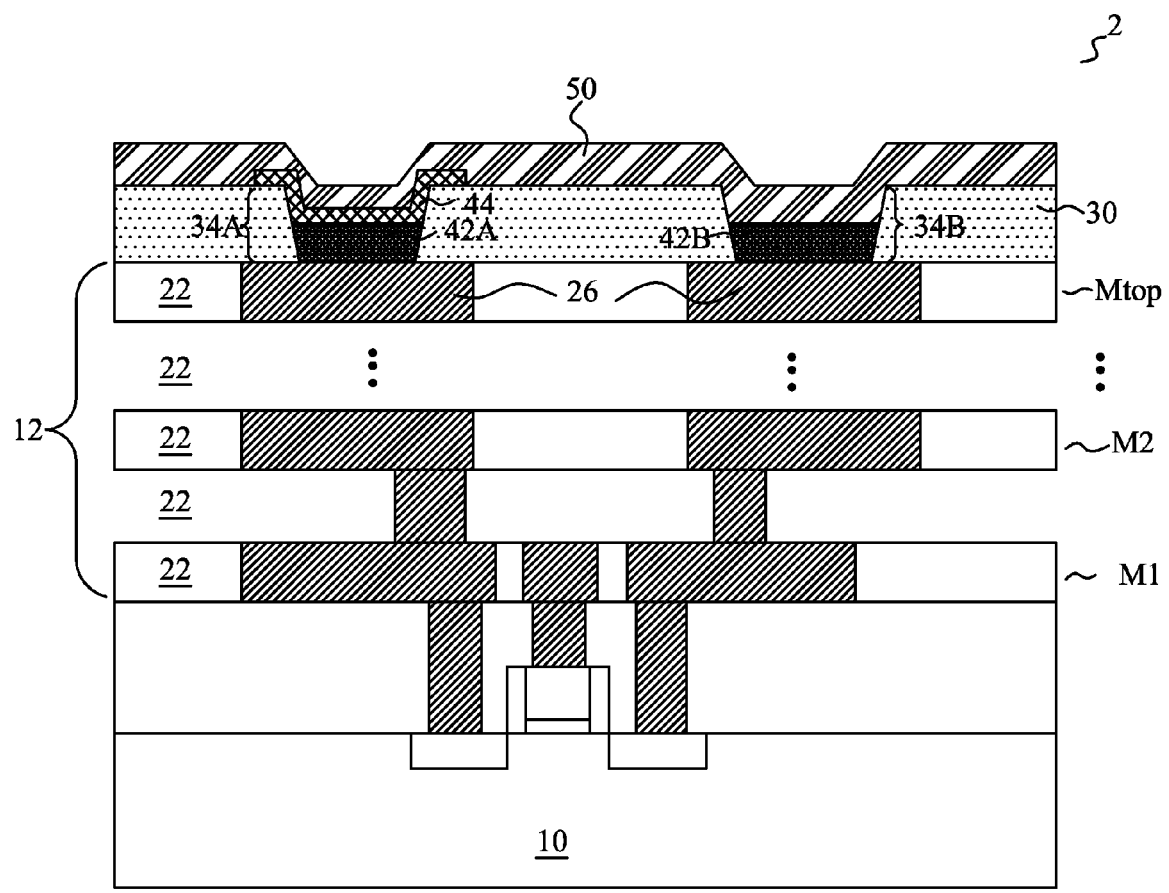

Referring to FIG. 7, photo resist 46 is formed and patterned, and is used to pattern insulation layer 44. The portion of insulation layer 44 in opening 34A is left, while the portions of insulation layer 44 directly over the top surface of passivation layer 30 and the portion of insulation layer 44 extending into opening 34B are removed. Photo resist 46 is then removed. The resulting insulation layer 44 is illustrated in FIG. 8. The remaining portion of insulation layer 44 may include a portion in opening 34A, and a portion above, and vertically overlapping, a portion of passivation layer 30. Next, as also shown in FIG. 8, aluminum-containing layer 50 is blanket formed, for example, using PVD. Aluminum-containing layer 50 extends into openings 34A and 34B. The material of aluminum-containing layer 50 may be selected from the same candidate materials of aluminum-containing layer 36 (FIG. 3). Further, the material of aluminum-containing layer 50 and the material of aluminum-containing layer 36 may be the same, or may be different.

Figure 9:
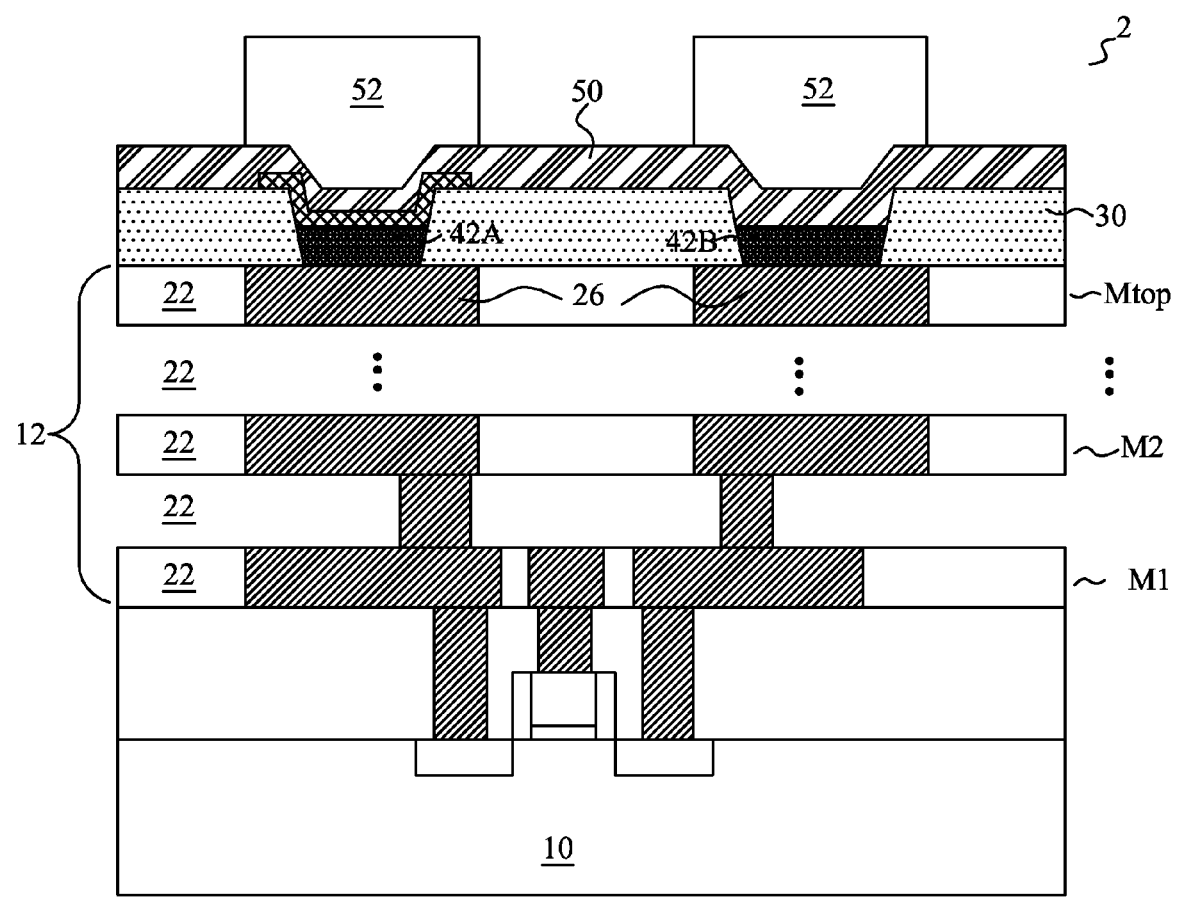
Figure 10:
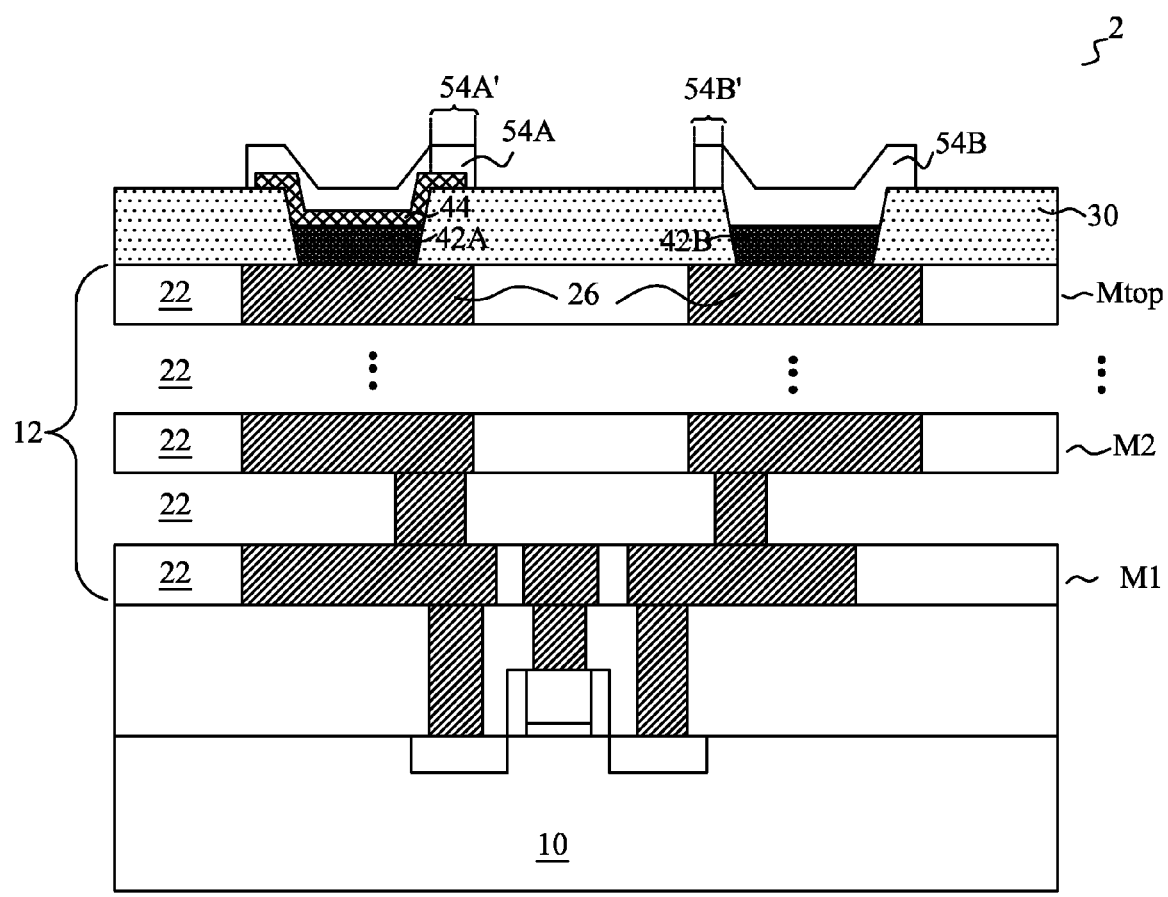

Referring to FIGS. 9 and 10, aluminum-containing layer 50 is patterned. As shown in FIG. 9, photo resist 52 is formed, and is then patterned. Next, aluminum-containing layer 50 is patterned using photo resist 52 as a mask, and the resulting structure is shown in FIG. 10. The remaining portions of aluminum-containing layer 50 include portion 54A (referred to as aluminum-containing pad 54A hereinafter) directly over and contacting insulation layer 44, and portion 54B (referred to as aluminum-containing pad 54B hereinafter) directly over and contacting aluminum-containing pad 42B. Each of aluminum-containing pads 54A and 54B may include a portion (for example, 54A' and 54B') extending above, and vertically overlapping, a portion of passivation layer 30. In the resulting structure, aluminum-containing pad 42B, insulation layer 44, and aluminum-containing pad 54A form the bottom electrode, the insulator, and the top electrode, respectively, of capacitor 56. On the other hand, aluminum-containing pad 54B contacts aluminum-containing pad 42B to form an integrated aluminum-containing pad 54B/42B.

Figure 11:
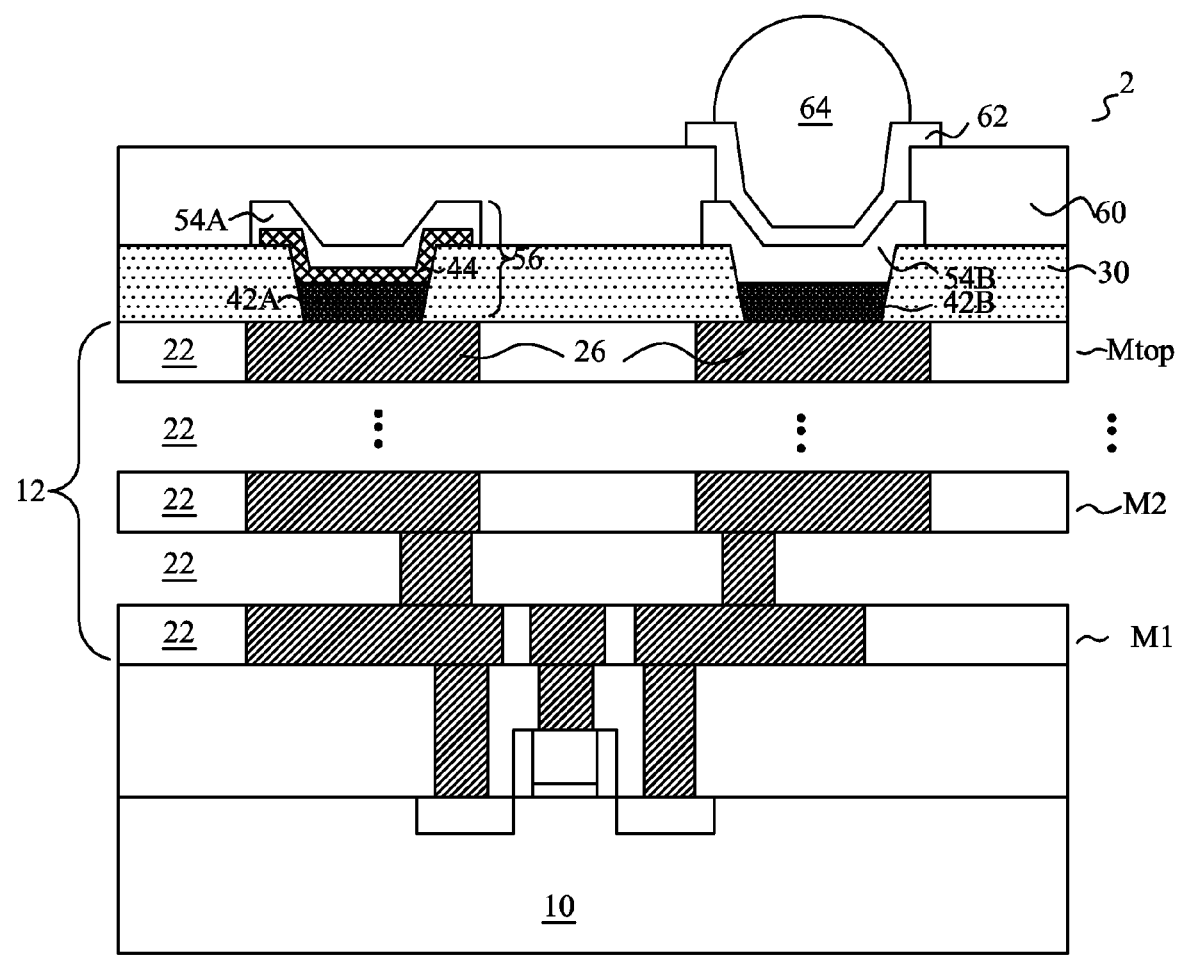

FIG. 11 illustrates a structure after additional layers are formed over capacitor 56 and aluminum-containing pad 54B/42B. In an embodiment, passivation layer 60 is formed. Capacitor 56 may be covered by passivation layer 60, although top electrode 54A may also be exposed through an opening (not shown) in passivation layer 60 if an external pad is to be electrically coupled to top electrode 54A. Passivation layer 60 may be formed of an organic material such as polyimide, although it may also be formed of a non-organic material such as silicon, silicon nitride, or multi-layers thereof. Under-bump metallurgy (UBM) 62, which may be formed of a titanium layer (not shown) and a copper layer (not shown) over the titanium layer, is formed in an opening in passivation layer 60, and is electrically coupled to aluminum-containing pad 54B/42B. Although FIG. 11 illustrates that UBM 62 is directly over aluminum-containing pad 54B/42B, feature 54B may also be used as a redistribution line (similar to redistribution line 70 in FIG. 12) to re-route the connection of aluminum-containing pad 54B/42B, and hence UBM 62 is not directly over aluminum-containing pad 54B/42B. Next, metal bump 64 is formed on UBM 62. Metal bump 64 may be a solder bump or a copper pillar bump.

Figure 12:
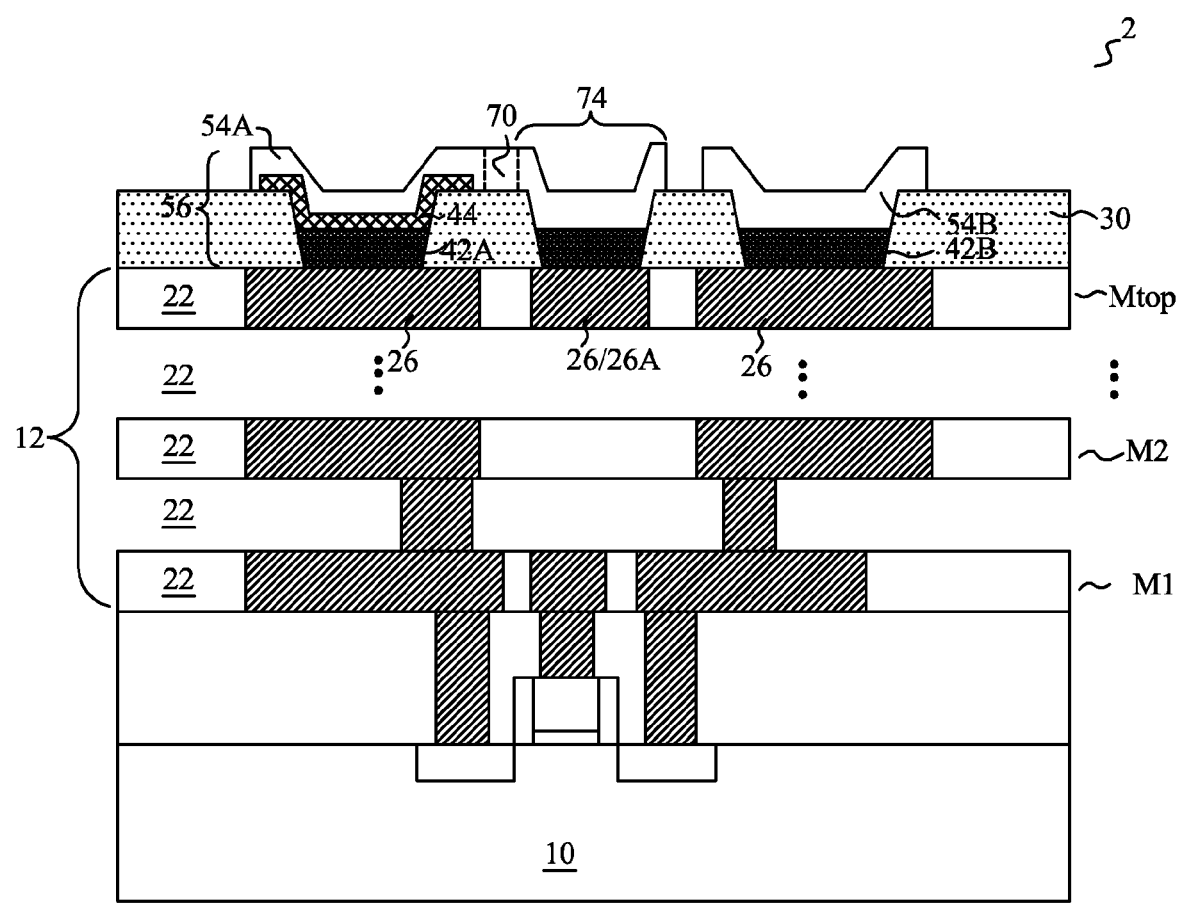
FIG. 12 illustrates a cross-sectional view of a MIM capacitor with both the top electrode and the bottom electrode electrically coupled to underlying metal layers.

FIG. 12 illustrates the connection of top electrode 54A of capacitor 56 to one of metal lines 26A in top metal layer Mtop. The electrical connection may be achieved through aluminum-containing line 70 and aluminum-containing pad 74. Aluminum-containing line 70 may be formed simultaneously with the formation of top electrode 54A, and may be a portion of the patterned aluminum-containing layer 50 as in FIG. 8. Aluminum-containing pad 74 may be formed using essentially the same method, and formed simultaneously as, aluminum-containing pad 54B/42B. Accordingly, the materials and the formation process of aluminum-containing line 70 and aluminum-containing pad 74 are not discussed herein.

In the embodiments, with capacitor 56 (FIGS. 11 and 12) formed in passivation layer 30 and overlying layers, the formation process may be integrated with the formation of aluminum-containing features. Therefore, the process is simple because no extra features are needed to prevent the reaction between copper and the insulator. The manufacturing cost is thus lowered.

In accordance with embodiments, a device includes a top metal layer over a substrate; a copper-containing metal feature in the top metal layer; a passivation layer over the top metal layer; and a capacitor. The capacitor includes a bottom electrode including at least a portion in the passivation layer, wherein the bottom electrode includes aluminum; an insulator over the bottom electrode; and a top electrode over the insulator.

In accordance with other embodiments, a device includes a plurality of metal layers over a substrate and comprising a top metal layer. The top metal layer further includes a low-k dielectric layer having a k value lower than 3.8, and a metal line in the low-k dielectric layer. The device further includes a passivation layer over the top metal layer, and a capacitor. The capacitor includes a bottom electrode including at least a portion in the passivation layer and contacting the metal line, wherein the bottom electrode comprises aluminum; an insulator over the bottom electrode; and a top electrode over the insulator. A metal pad includes a lower portion in the passivation layer and formed of a same material as the bottom electrode, and an upper portion over and contacting the lower portion, wherein the upper portion is formed of a same material as the top electrode.

In accordance with yet other embodiments, a device includes a top metal layer including a low-k dielectric layer having a k value lower than 3.8; and a copper line in the low-k dielectric layer. A passivation layer is disposed over the top metal layer. A capacitor includes a bottom electrode in the passivation layer and electrically coupled to the copper line. The bottom electrode includes a top surface lower than a top surface of the passivation layer, wherein the bottom electrode includes top edges level with the top surface of the passivation layer. The capacitor further includes an insulator over the bottom electrode, wherein portions of the insulator extend to directly over portions of the passivation layer; and a top electrode over the insulator, wherein the bottom electrode and the top electrode comprise aluminum copper, and wherein portions of the insulator and portions of the top electrode extend from inside the passivation layer to directly over portions of the passivation layer.

In accordance with yet other embodiments, a method includes providing a wafer including a substrate; and a top metal layer over the substrate, wherein the top metal layer includes a dielectric layer, and a copper-containing metal line in the dielectric layer. The method further includes forming a passivation layer over the top metal layer; forming an opening in the passivation layer, with the copper-containing metal line exposed through the opening; and forming a capacitor comprising a bottom electrode, wherein a portion of the bottom electrode is in the opening.

In accordance with yet other embodiments, a method of forming a device includes providing a wafer comprising a substrate; and a top metal layer over the substrate, wherein the top metal layer comprises a first dielectric layer, and a first and a second copper-containing metal line in the first dielectric layer. The method further includes forming a first passivation layer over the top metal layer; forming a first and a second opening in the first passivation layer, with the first and the second copper-containing metal lines exposed through the first and the second openings, respectively; depositing a first aluminum-containing layer over the first passivation layer and extending into the first and the second openings; patterning the first aluminum-containing layer to form a bottom electrode of a capacitor in the first opening, and a lower portion of an aluminum-containing pad in the second opening; forming an insulation layer over the bottom electrode, the first passivation layer, and the lower portion of the aluminum-containing pad; patterning the insulation layer to form an insulator of the capacitor over and contacting the bottom electrode, wherein the insulation layer is removed from the second opening; depositing a second aluminum-containing layer over and contacting the insulator, the first passivation layer, and the lower portion of the aluminum-containing pad; and patterning the second aluminum-containing layer to form a top electrode of the capacitor directly over the insulator, and an upper portion of the aluminum-containing pad directly over and contacting the lower portion of the aluminum-containing pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate;
    a top metal layer over the substrate;
    a copper-containing metal feature in the top metal layer;
    a first passivation layer over the top metal layer; and
    a capacitor comprising:
        a bottom electrode comprising at least a portion in the first passivation layer, wherein the bottom electrode comprises aluminum;
        an insulator over the bottom electrode, wherein the insulator comprises an edge overlying the first passivation layer; and
        a top electrode over the insulator, wherein the top electrode extends beyond the edge of the insulator, and wherein the top electrode comprises a bottom contacting a top surface of the first passivation layer.

2. The device of claim 1, wherein the top metal layer comprises a low-k dielectric layer having a k value lower than 3.8, with the copper-containing metal feature in the low-k dielectric layer, and wherein the first passivation layer comprises a non-low-k dielectric material having a k value greater than 3.9.

3. The device of claim 1, wherein the insulator comprises a portion in the first passivation layer.

4. The device of claim 1 further comprising an aluminum-containing pad comprising an upper portion extending to above the first passivation layer, and a lower portion in the first passivation layer and electrically coupled to a copper-containing line in the top metal layer.

5. The device of claim 1, wherein the top electrode comprises aluminum.

6. The device of claim 1, wherein top edges of the bottom electrode are level with the top surface of the first passivation layer.

7. The device of claim 1, wherein top edges of the bottom electrode are lower than the top surface of the first passivation layer.

8. The device of claim 3, wherein the top electrode comprises a portion in the first passivation layer.

9. The device of claim 4 further comprising:
    a second passivation layer over the first passivation layer, wherein the aluminum-containing pad is directly under an opening in the second passivation layer; and
    an under-bump metallurgy (UBM) extending from above the second passivation layer down to contact the aluminum-containing pad.

10. A device comprising:
    a substrate;
    a plurality of metal layers over the substrate and comprising a top metal layer, wherein the top metal layer further comprises:
        a low-k dielectric layer having a k value lower than 3.8; and
        a metal line in the low-k dielectric layer;
    a passivation layer over the top metal layer;
    a capacitor comprising:
        a bottom electrode comprising at least a portion in the passivation layer and contacting the metal line, wherein the bottom electrode comprises aluminum;
        an insulator over the bottom electrode; and
        a top electrode over the insulator; and
    a metal pad comprising:

a lower portion in the passivation layer and formed of a same material as the bottom electrode; and an upper portion over and contacting the lower portion, wherein the upper portion is formed of a same material as the top electrode.

11. The device of claim 10, wherein the bottom electrode comprises aluminum copper, and wherein the metal line comprises substantially pure copper.

12. The device of claim 10, wherein the passivation layer comprises a non-low-k material having a k value greater than 3.9.

13. The device of claim 10, wherein the top electrode comprise aluminum copper.

14. The device of claim 10, wherein the bottom electrode comprises top edges level with a top surface of the passivation layer.

15. The device of claim 10, wherein the top electrode comprises portions above a top surface of the passivation layer.

16. The device of claim 10 further comprising:
a redistribution line formed of a same material as the top electrode;
an aluminum-containing pad in the passivation layer; and
a copper-containing line in the top metal layer, wherein the top electrode is electrically coupled to the copper-containing line through the redistribution line and the aluminum-containing pad.

17. A device comprising:
a top metal layer comprising:
a low-k dielectric layer having a k value lower than 3.8; and
a copper line in the low-k dielectric layer;
a passivation layer over the top metal layer; and
a capacitor comprising:
a bottom electrode in the passivation layer and electrically coupled to the copper line, wherein the bottom electrode comprises a top surface lower than a top surface of the passivation layer, and wherein the bottom electrode comprises top edges level with the top surface of the passivation layer;
an insulator over the bottom electrode, wherein portions of the insulator extend to directly over portions of the passivation layer; and
a top electrode over the insulator, wherein the bottom electrode and the top electrode comprise aluminum copper, and wherein portions of the insulator and portions of the top electrode extend from inside the passivation layer to directly over portions of the passivation layer.

18. The device of claim 17 further comprising an aluminum-containing pad comprising:
a lower portion in the passivation layer; and
an upper portion over and contacting the lower portion, wherein the upper portion extends to above the passivation layer, and wherein the lower portion and the upper portion are formed of aluminum copper.

19. The device of claim 17, wherein a bottom surface of the bottom electrode contacts the copper line in the low-k dielectric layer.

* * * * *